US010097034B2

(12) United States Patent
Hsieh et al.

(10) Patent No.: US 10,097,034 B2
(45) Date of Patent: Oct. 9, 2018

(54) UPS SYSTEM WITH NETWORK MONITORING AND ATTACHED BATTERY PACK INFORMATION SENSING FUNCTIONS

(71) Applicant: CyberPower Systems, Inc., Taipei (TW)

(72) Inventors: Hung-Ming Hsieh, Taipei (TW); Hung-Chun Chien, Taipei (TW); Yung-Hao Peng, Taipei (TW)

(73) Assignee: CYBERPOWER SYSTEMS, INC., Taipei (TW)

( * ) Notice: Subject to any disclaimer, the term of this patent is extended or adjusted under 35 U.S.C. 154(b) by 634 days.

(21) Appl. No.: 14/572,117

(22) Filed: Dec. 16, 2014

(65) Prior Publication Data

US 2016/0172901 A1 Jun. 16, 2016

(51) Int. Cl.
*H02J 9/06* (2006.01)
*G01R 31/36* (2006.01)
*H02J 7/00* (2006.01)

(52) U.S. Cl.
CPC .......... *H02J 9/061* (2013.01); *G01R 31/3606* (2013.01); *H02J 7/007* (2013.01); *H02J 2007/0098* (2013.01)

(58) Field of Classification Search
CPC .................................. H02J 9/06; G01R 31/00
USPC ....................................................... 307/64, 66
See application file for complete search history.

(56) References Cited

U.S. PATENT DOCUMENTS

| | | | | |
|---|---|---|---|---|
| 5,982,652 A * | 11/1999 | Simonelli | ............... | H02J 9/062 307/26 |
| 6,274,950 B1 * | 8/2001 | Gottlieb | ............. | G01R 31/3648 307/66 |
| 8,994,339 B1 * | 3/2015 | Kam | ...................... | H02J 7/0029 320/150 |
| 9,087,315 B1 * | 7/2015 | Meyers | ................ | G06Q 10/087 |
| 9,352,905 B2 * | 5/2016 | Fly | | |
| 9,627,720 B2 * | 4/2017 | Yun | ...................... | H01M 10/486 |
| 9,772,666 B1 * | 9/2017 | Kam | ......................... | G06F 1/28 |
| 2003/0137277 A1 * | 7/2003 | Mori | .................. | G01R 31/3648 320/132 |
| 2006/0186739 A1 * | 8/2006 | Grolnic | ..................... | G06F 1/30 307/64 |
| 2007/0108946 A1 * | 5/2007 | Yamauchi | ............. | H01M 10/42 320/132 |

(Continued)

*Primary Examiner* — Adi Amrany
(74) *Attorney, Agent, or Firm* — Muncy, Geissler, Olds & Lowe, P.C.

(57) ABSTRACT

A UPS system with network monitoring and attached battery pack information sensing functions includes a UPS apparatus including a UPS body and a UPS monitoring module, and attached battery packs coupled to the UPS body. Each attached battery pack includes a battery pack body, and a battery pack monitoring module that includes a control unit, a sensor module for detecting the status information of the battery pack body, a memory, and a network interface for communication with the UPS monitoring module through a local area network to transmit the status information of the battery pack body. When the battery pack monitoring module transmits the status information to the UPS monitoring module, the manager can link a web browser of an external equipment to a battery pack status page provided by a built-in web server of the UPS monitoring module to get the status information of every attached battery pack.

9 Claims, 8 Drawing Sheets

(56) References Cited

U.S. PATENT DOCUMENTS

| | | | |
|---|---|---|---|
| 2008/0042492 A1* | 2/2008 | Gleason | H02J 9/062 307/66 |
| 2009/0021217 A1* | 1/2009 | Nakazawa | H01M 2/34 320/134 |
| 2009/0228225 A1* | 9/2009 | Burgess | G01R 31/3651 702/63 |
| 2009/0309421 A1* | 12/2009 | Angquist | H02J 3/1842 307/46 |
| 2010/0116570 A1* | 5/2010 | Sugawara | B60K 1/04 180/65.1 |
| 2010/0244567 A1* | 9/2010 | Brookshire | H01M 10/48 307/66 |
| 2010/0264877 A1* | 10/2010 | Ashida | H01M 10/443 320/116 |
| 2011/0049992 A1* | 3/2011 | Sant'Anselmo | F03D 9/007 307/64 |
| 2011/0148363 A1* | 6/2011 | Frisch | G01R 19/16542 320/162 |
| 2011/0155485 A1* | 6/2011 | Tsurumi | H01M 2/0237 180/65.1 |
| 2011/0276810 A1* | 11/2011 | Chang | G06F 1/263 713/300 |
| 2013/0043729 A1* | 2/2013 | Yoshida | G06F 1/263 307/65 |
| 2013/0099756 A1* | 4/2013 | Mohr | H02J 7/0068 320/134 |
| 2013/0169038 A1* | 7/2013 | King | B60L 3/0046 307/10.1 |
| 2013/0264865 A1* | 10/2013 | Sugeno | H02J 5/00 307/9.1 |
| 2015/0046109 A1* | 2/2015 | Miwa | G01R 31/3679 702/63 |
| 2015/0074365 A1* | 3/2015 | Uehara | G06F 1/263 711/162 |
| 2015/0194707 A1* | 7/2015 | Park | H01M 10/4207 429/50 |
| 2015/0338894 A1* | 11/2015 | Cohen | G06F 1/263 713/310 |
| 2016/0046199 A1* | 2/2016 | Butler | B60L 11/1846 320/106 |
| 2016/0197504 A1* | 7/2016 | Hsia | H02J 7/0045 307/23 |
| 2016/0294204 A1* | 10/2016 | Deokar | H02M 3/33561 |
| 2016/0322861 A1* | 11/2016 | Budde | H02J 7/0052 |
| 2017/0104365 A1* | 4/2017 | Ghosh | H02J 9/061 |
| 2017/0117587 A1* | 4/2017 | Sugeno | H01M 10/425 |

\* cited by examiner

Log-in IP address : 192.168.10.178

IP address of newly attached battery pack : 192.168.10.174

Name of battery pack : Battery Pack #2

(Newly added)

Current battery pack :

| IP address | Name of battery pack |
|---|---|
| 192.168.10.171 | Battery Pack #1 |

FIG.5

Log-in IP address   192.168.10.178

Status                      Fully charged
   Battery pack voltage     54.2 V
   Remaining runtime      118 mins Name Battery Pack #1

Internal voltage 1 ( V1 )    27.1 V
   Internal voltage 2 ( V1' )   27.2 V
   Temperature ( T1 )       27° C IP address
                                      192.168.10.171

Name Battery Pack #2

Battery module 1

Internal voltage 1 ( V2 )    27.2 V
   Internal voltage 2 ( V2' )   27.2 V
   Temperature ( T2 )       28° C Battery module 2

Internal voltage 1 ( V2 )    27.1 V
   Internal voltage 2 ( V2' )   27.1 V
   Temperature ( T2 )       27° C IP address
                                      192.168.10.174

Name Battery Pack #3

Battery module 1

Internal voltage 1 ( V1 )    27.1 V
   Internal voltage 2 ( V1' )   27.1 V
   Temperature ( T1 )       27° C Battery module 2

Internal voltage 1 ( V2 )    27.2 V
   Internal voltage 2 ( V2' )   27.2 V
   Temperature ( T2 )       28° C

電池模組 3

Internal voltage 1 ( V3 )    27.2 V
   Internal voltage 2 ( V3' )   27.1 V
   Temperature ( T3 )       28° C IP address
                                      192.168.10.177

*FIG. 6*

UPS SYSTEM WITH NETWORK MONITORING AND ATTACHED BATTERY PACK INFORMATION SENSING FUNCTIONS

BACKGROUND OF THE INVENTION

1. Field of the Invention

The present invention relates to UPS (Uninterruptible Power Supply) technology and more particularly, to a UPS system with network monitoring and attached battery pack information sensing functions, wherein a battery pack monitoring module of each attached battery pack detects the status information of the respective battery pack body and transmits the detected status information through a LAN (Local Area Network) to a UPS monitoring module of a UPS apparatus, allowing a manager using a web browser of an external equipment to link to a built-in web server of the UPS monitoring module through the LAN to obtain the displayed status information of the attached battery pack.

2. Description of the Related Art

With the vigorous development of modern electronic and information technology, computer designers have been developing systems having the characteristics of strong computing power, high operating speed and small size. Since many electronic devices or equipments use a computer to control their actions or the execution of their functions, the computer plays an important role in the industry. While taking into account the stability of the overall system, as well as the possibility of component damage, shortening of the lifespan and data loss being caused by an interruption of the power supply, the quality of the supply of power will be even more important. In order to solve the above-described power supply problem, the common way is to use a UPS apparatus (UPS) that automatically switches to battery power supply mode or external DC power supply mode to provide emergency power to the load when the input power source fails. The UPS apparatus performs the functions of power supply regulation, surge and noise filtering and lightning protection to provide stabilized power supply to the computer, server, networking equipment, security monitoring system, medical equipment, data storage center and/or industrial equipment for normal operation. In business operation, there are a many electronic devices or equipment integrated in various telecommunication or communication cabinets in the machine room, such as computers or servers, storage systems and equipment (network-attached storage systems, disk arrays, etc.), computer peripherals (modem, switch, or router, etc.) or other information equipment. In order to provide power electronic devices or equipment with longer power backup time, it is the normal way to use a UPS apparatus having the function of supporting attached battery pack. When wishing to expand the capacity of the machine room or to upgrade the information equipment, it simply needs to increase the number of the attached battery packs. Increasing the number of the attached battery packs can enhance the power supply capacity of the UPS apparatus to effectively extend the power backup time, and to well protect more electronic devices or equipment.

Referring to FIGS. 7 and 8, a system architecture diagram of a UPS apparatus, attached battery packs and an external equipment according to the prior art and a block diagram of an attached battery pack according to the prior art are shown. As illustrated, the UPS apparatus A comprises a network monitoring module A 1 linkable to the external equipment C through a local area network, and is electrically coupled with multiple attached battery packs B. Each attached battery pack B comprises a battery cell B 1 and a DC input/output interface B 2 electrically coupled with the battery cell B 1. The connection between the UPS apparatus A and the DC input/output interface B 2 of each attached battery pack B is achieved by a DC bus without any other communication interface means. Therefore, it can simply access to the DC bus to obtain DC voltage from the attached battery packs B without allowing the use of this DC voltage to determine the number of the attached battery packs B. In addition to DC bus connection, some other UPS apparatuses have a built-in communication interface for obtaining the information of each individual attached battery pack. However, the communication interfaces of these UPS apparatuses commonly adopt serial communication interface.

When the manager inputs the IP address of the network monitoring module A1 into the web browser of a computer, notebook computer or any other external equipment C to link to the UPS apparatus, the manager can simply know the DC voltage of the attached battery packs B through the display on the web browser without knowing the information (voltage, internal charging current, temperature) of each individual attached battery pack B. The aforesaid prior art UPS apparatuses allow the manager to obtain the information of each individual attached battery pack through their built-in communication interfaces, however, these built-in communication interfaces are serial communication interface (such as RS-232). If the loop of one attached battery pack is abnormal, the manager will be unable to get the information of the other attached battery packs in the backend or to know the current system status of the UPS apparatus. Thus, the manager cannot replace the failed or damaged attached battery packs B or take the necessary measures at an early stage, causing the overall performance and effectiveness of the UPS apparatus to be limited. An improvement in this regard is necessary.

SUMMARY OF THE INVENTION

The present invention has been accomplished under the circumstances in view. It is therefore the main object of the present invention to provide a UPS system with network monitoring and attached battery pack information sensing functions, which comprises a UPS apparatus comprising a UPS body and a UPS monitoring module, and attached battery packs coupled to the UPS body. Each attached battery pack comprises a battery pack body, and a battery pack monitoring module that comprises a control unit, a sensor module for detecting the status information of the battery pack body of each attached battery pack, a memory, and a network interface for communication with the UPS monitoring module through a local area network to transmit the status information of the battery pack body. When the battery pack monitoring module transmits the status information of the battery pack body to the UPS monitoring module, the manager can use a web browser of an external equipment to link to a battery pack status page provided by a built-in web server of the UPS monitoring module to get the status information of every attached battery pack. The UPS apparatus and the attached battery packs use a local area network for data transmission and communication. This method also effectively eliminates the problem of the use of a serial communication interface that when the loop of one attached battery pack is abnormal, the manager cannot get the information of the other attached battery packs in the backend, or know the current system status of the UPS apparatus, ensuring the stability and reliability of the overall system.

It is another object of the present invention to provide a UPS system with network monitoring and attached battery pack information sensing functions, which allows the manager to use a web browser of an external equipment through a local area network to link to the UPS apparatus and then to input an IP address or MAC address into the newly added page provided by the built-in web server of the UPS monitoring module to add a new battery pack for management. Thus, the UPS monitoring module of the UPS apparatus will transmit a request network packet to the battery pack monitoring module of the attached battery pack for handshaking. The request network packet contains the authentication data. After the battery pack monitoring module received the request network packet of the UPS monitoring module and accepted to be added into management and sent back a reply network packet, it timely transmits the status information of the battery pack body to the UPS monitoring module, and the web server provides a battery pack status page to display the status information of every attached battery pack status information. The manager can also use the web browser of the external equipment to link to the battery pack status page being provided by the web server to get the status information of every attached battery pack. An authentication method between the UPS monitoring module of the UPS apparatus and the battery pack monitoring module of each attached battery pack can effectively prohibit any unauthorized network equipment from accessing to the attached battery packs.

It is still another object of the present invention to provide a UPS system with network monitoring and attached battery pack information sensing functions, which allows the manager to set the event notification of the UPS apparatus through the web browser of the external equipment. When the UPS monitoring module receives a status information from the battery pack monitoring module of one attached battery pack and the received status information is verified by the second microcontroller to be in conformity with the set condition of pre-stored data in the memory, the UPS monitoring module will send a network packet of status information or warning message (such as short massage, e-mail, sound signal, voice, light signal, etc.) through the network interface to the manager's external equipment. For example, if the UPS monitoring module receives a message that the temperature of the battery pack body been detected by the battery pack monitoring module is over 45° C., it will give off a warning message to notify the manager, enabling the manager to replace the failed or damaged battery pack or the battery pack going to be expired at an early stage, preventing any UPS apparatus failure due to a short circuit or failure of one attached battery pack, thereby increasing the convenience in the management of the UPS apparatus and the attached battery packs to protect various electronic devices or equipments and to effectively prolong power backup time.

Other advantages and features of the present invention will be fully understood by reference to the following specification in conjunction with the accompanying drawings, in which like reference signs denote like components of structure.

BRIEF DESCRIPTION OF THE DRAWINGS

FIG. 5 illustrates a newly added page of the battery pack management of the web server in accordance with the present invention.

FIG. 6 illustrates a status page of the battery pack management of the web server in accordance with the present invention.

DETAILED DESCRIPTION OF THE PREFERRED EMBODIMENT

Figure 1:
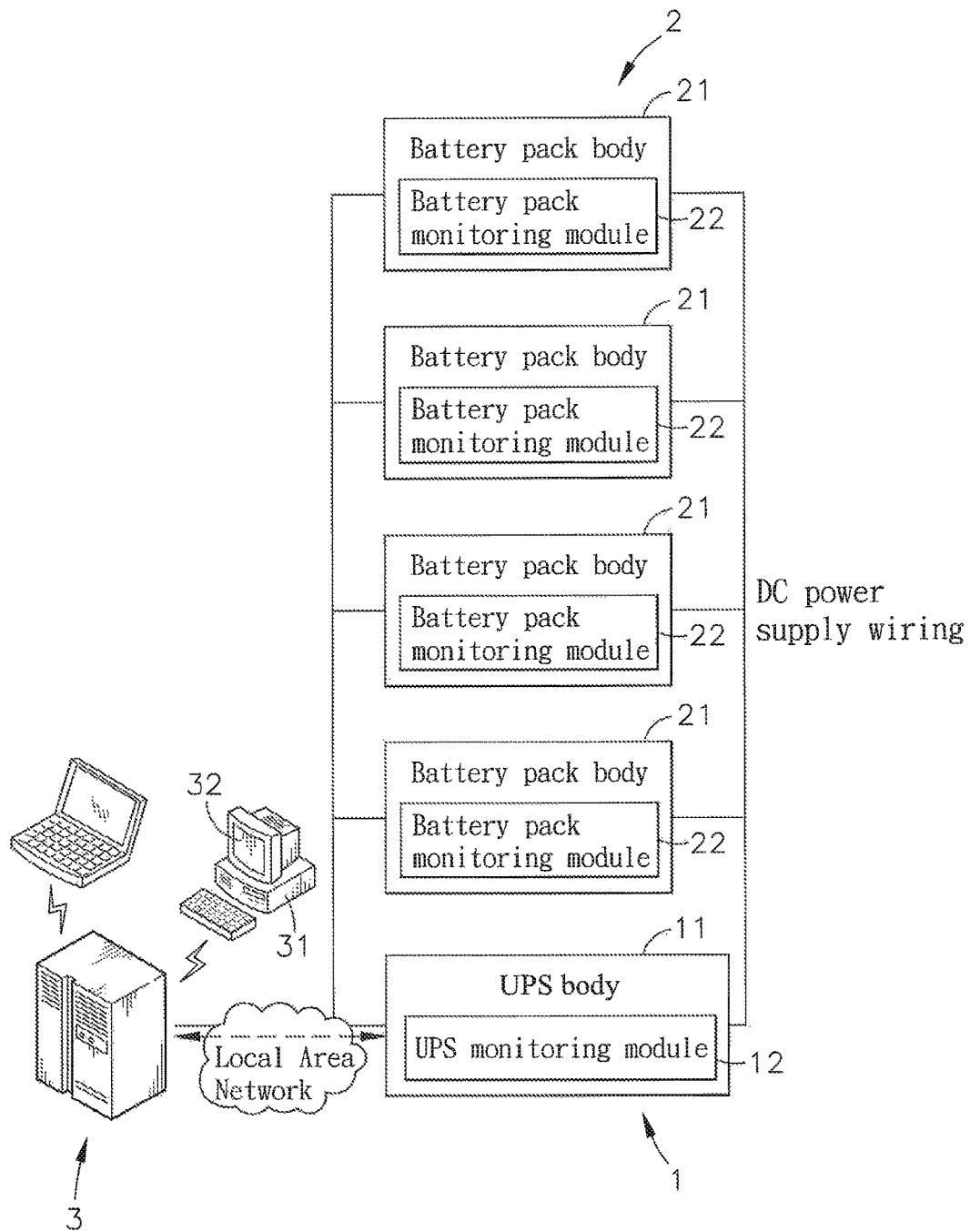
FIG. 1 illustrates a system architecture diagram of a UPS system of UPS apparatus, attached battery pack and external equipment in accordance with the present invention.
Figure 2:
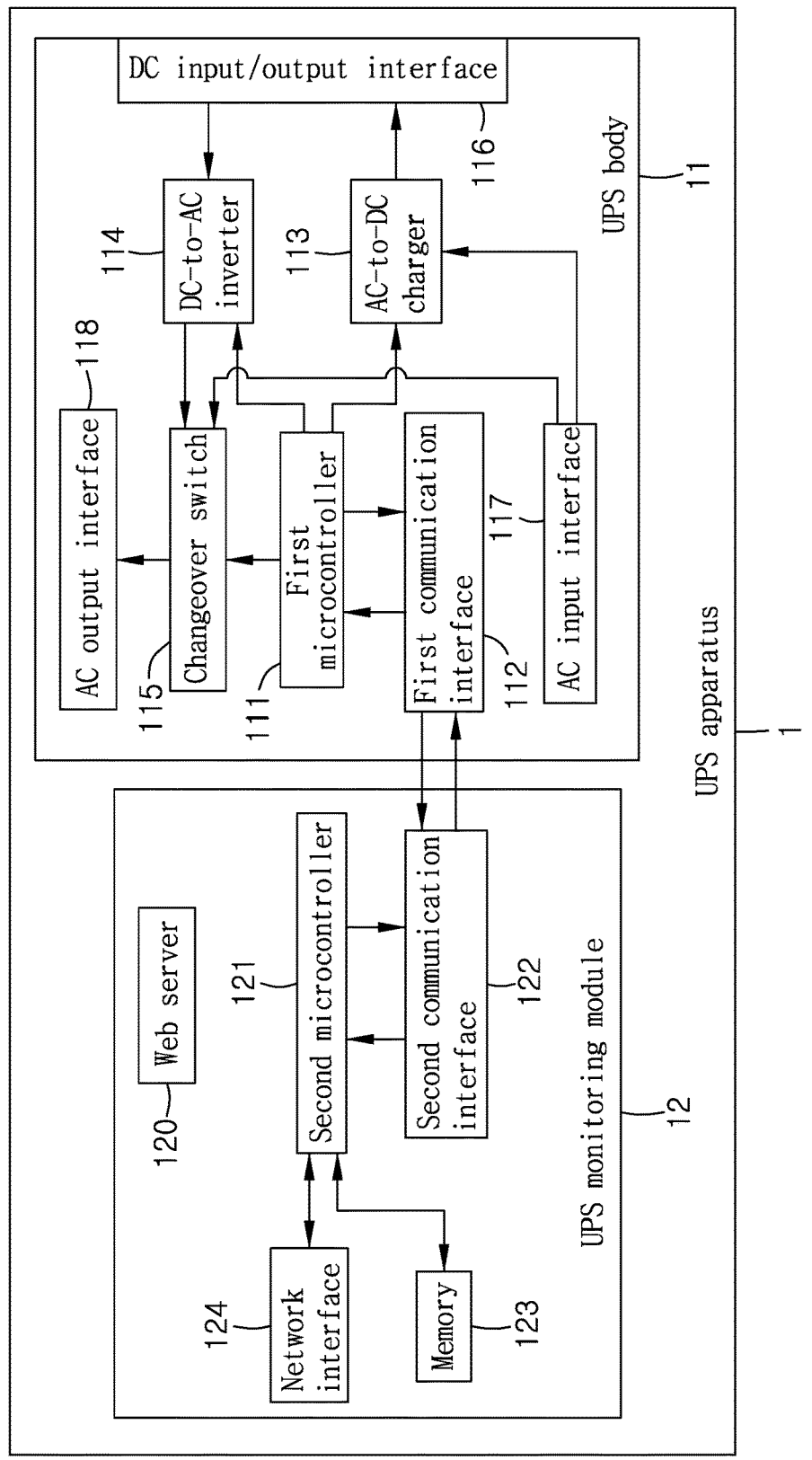
FIG. 2 is a block diagram of the UPS apparatus in accordance with the present invention.
Figure 3:
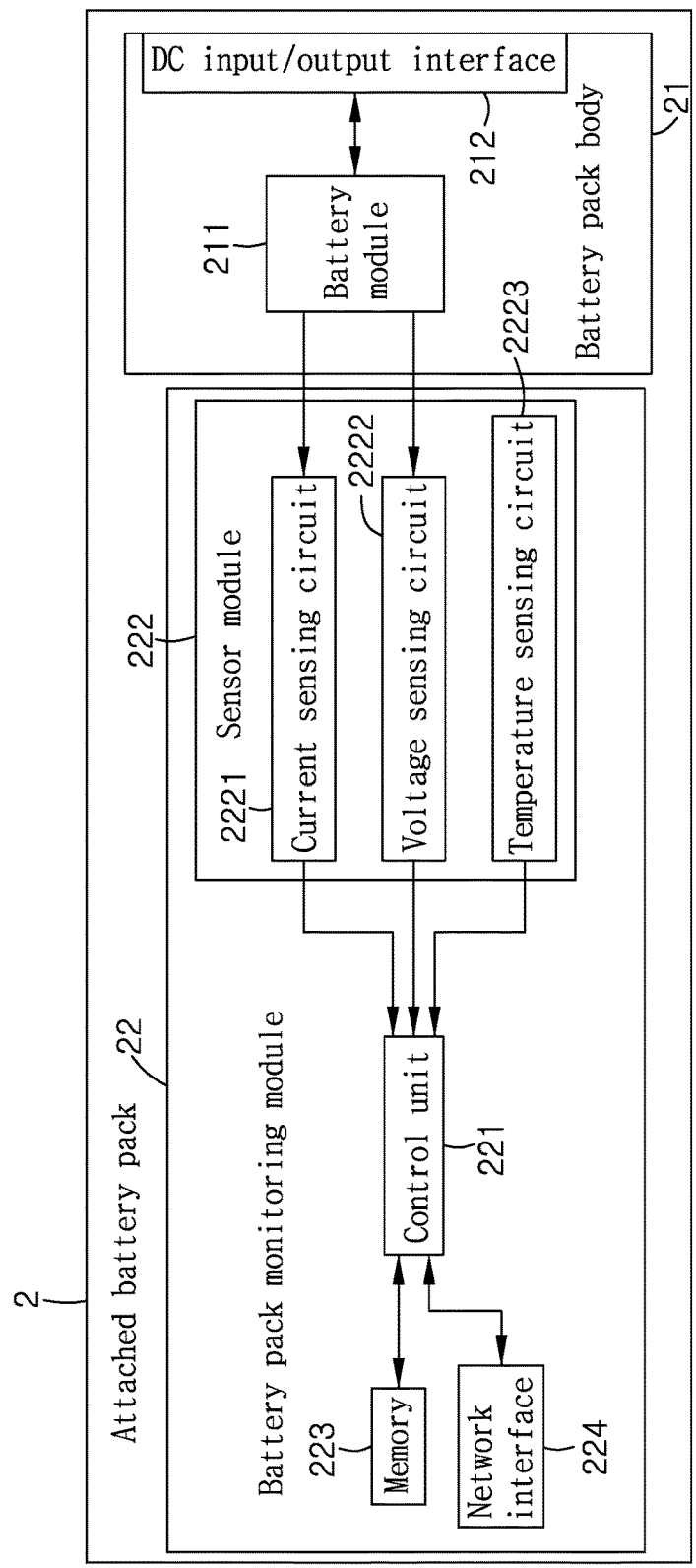
FIG. 3 is a block diagram of one attached battery pack in accordance with the present invention.

Referring to FIGS. 1-3, a system architecture diagram of a UPS system of UPS apparatus, attached battery pack and external equipment, a block diagram of the UPS apparatus and a block diagram of the attached battery pack in accordance with the present invention are shown. The UPS system comprises a UPS apparatus 1, a plurality of attached battery packs 2, and an external equipment 3.

The UPS apparatus 1 comprises a UPS body 11 and a UPS monitoring module 12. The UPS body 11 comprises a first microcontroller 111, a first communication interface 112 in the form of, for example, USART (Universal Synchronous Asynchronous Receiver Transmitter), an AC-to-DC charger 113, a DC-to-AC inverter 114 and a changeover switch 115 respectively electrically coupled to the first microcontroller 111, a DC input/output interface 116 electrically coupled to the AC-to-DC charger 113 and the DC-to-AC inverter 114 for DC input and output, an AC input interface 117 electrically coupled to the AC-to-DC charger 113 and the changeover switch 115, and an AC output interface 118 electrically coupled to the changeover switch 115. Further, the changeover switch 115 is electrically coupled to the DC-to-AC inverter 114. When the UPS apparatus 1 is in the normal mode, the first microcontroller 111 controls the AC-to-DC charger 113 to convert input power supply into a predetermined DC power supply for output through the DC input/output interface 116. If an abnormal condition occurs in the UPS apparatus 1, the first microcontroller 111 controls the changeover switch 115 to switch to the DC-to-AC inverter 114, enabling the DC-to-AC inverter 114 to convert inputted DC power supply from the DC input/output interface 116 into AC power supply for output to a load through the AC output interface 118, and thus, the UPS apparatus provides emergency power to the load when the input power source fails. If the UPS apparatus 1 is in the Eco-mode, the first microcontroller 111 controls the changeover switch 115 to switch to a bypass, enabling the input power supply to be directly outputted to the load, reducing power loss, improving energy efficiency and achieving energy savings.

Further, the UPS monitoring module 12 comprises a built-in web server 120, a second microcontroller 121, a second communication interface 122 made in the form of, for example, a USART (Universal Synchronous Asynchronous Receiver Transmitter) and electrically coupled with the second microcontroller 121 and the first communication interface 112 of the UPS body 11, a memory 123 electrically connected to the second microcontroller 121 for storing TCP/IP or MAC (Media Access Control) address, manufacturers relational tables and other predetermined data, and a network interface 124 electrically connected to the second microcontroller 121 for network communication.

Each attached battery pack 2 comprises a battery pack body 21 and a battery pack monitoring module 22. The battery pack body 21 comprises at least one battery module 211, a DC input/output interface 212 electrically coupled to the battery module 211 for DC input and output. The DC input/output interface 212 of each attached battery pack 2 is electrically connected to the DC input/output interface 116 of the UPS body 11 through a respective DC bus so that the UPS body 11 can transmit DC power supply through the DC input/output interfaces 116;212 to the battery modules 211 for charging. Alternatively, the battery module 211 can transmit DC power supply through the DC input/output interface 212 to the DC-to-AC inverter 114 of the UPS body 11 via the DC input/output interface 116 for conversion into AC power supply, and then the first microcontroller 111 can control the changeover switch 115 to switch the transmission of converted AC power supply to the load, and thus, even if the input power supply is interrupted, the UPS apparatus 1 can still continuously provide AC power supply to the load. Further, the circuit application and conversion circuit design of the UPS body 11 of the UPS apparatus 1 can be variously embodied. In actual application, the UPS body 11 of the UPS apparatus 1 can be matched with the battery pack body 21 of each of at least one attached battery pack 2 to create an off-line, on-line or on-line interactive circuit design.

Further, the battery pack monitoring module 22 of the attached battery pack 2 comprises a control unit 221, which can be a MCU (Microcontroller Unit), CPU (Central Processing Unit) or any other suitable processor, a sensor module 222 electrically coupled to the control unit 221 for detecting the status information of the battery pack body 21, a memory 223 electrically coupled to the control unit 221 for storing TCP/IP or MAC (Media Access Control) address, manufacturers relational tables and other predetermined data, and a network interface 224 electrically coupled to the control unit 221 for communication with the network interface 124 of the UPS monitoring module 12 through a LAN (Local Area Network) to transmit the status information of the battery pack body 21. The sensor module 222 comprises a current sensing circuit 2221 for detecting the charging current of the battery module 211, a voltage sensing circuit 2222 for detecting the voltage of the battery pack body 21 and the internal voltage of the battery module 211, and a environmental sensing circuit 2223 for detecting the internal and surrounding temperature, moisture, air pressure, airflow and contact closure of the battery pack body 21.

The external equipment 3 can be a computer, notebook computer or any other control equipment, comprising a host 31 and a screen 32 electrically coupled to the host 31 for displaying the built-in web browser of the operating system. Through a LAN, such as Ethernet, IEEE802.11 (a/b/g/n) or WiMAX (IEEE802.16), the host 31 can be linked to the network interface 124 of the UPS monitoring module 12 for data transmission and communication.

Figure 4:
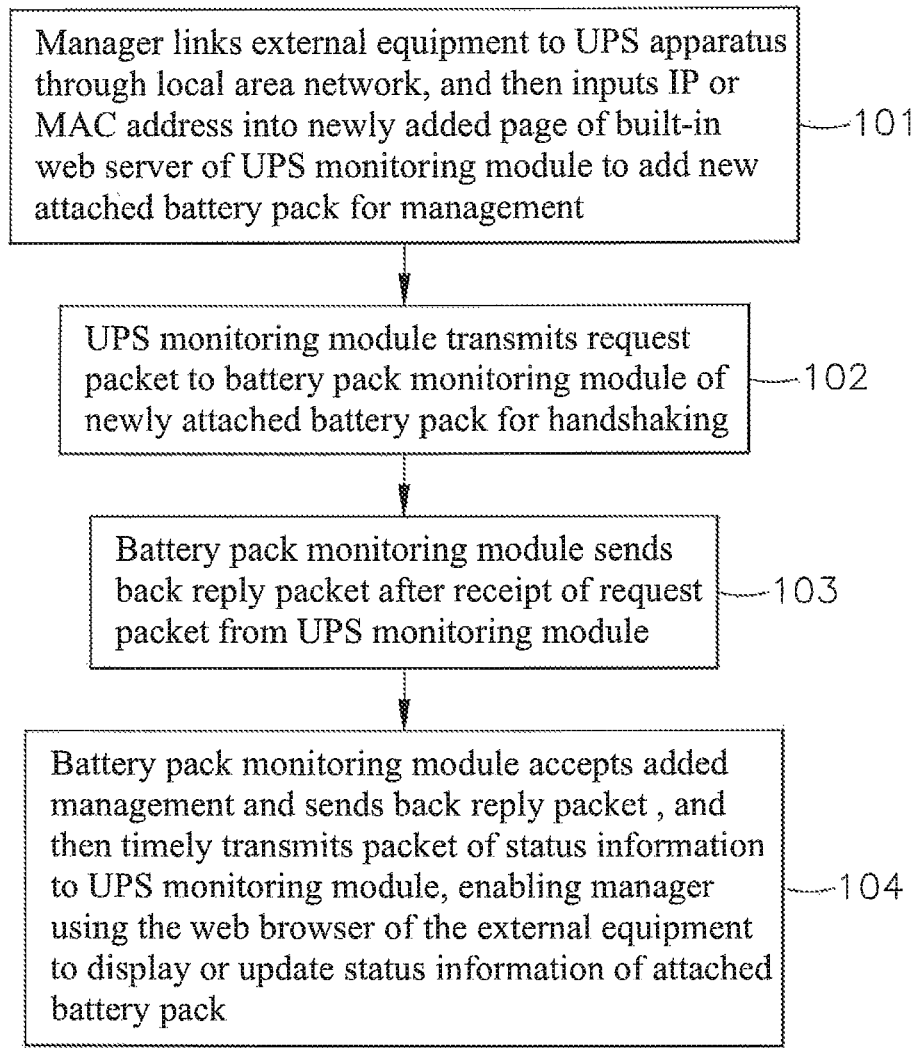
FIG. 4 is an operation flow chart of the preferred embodiment of the present invention.
Figure 7:
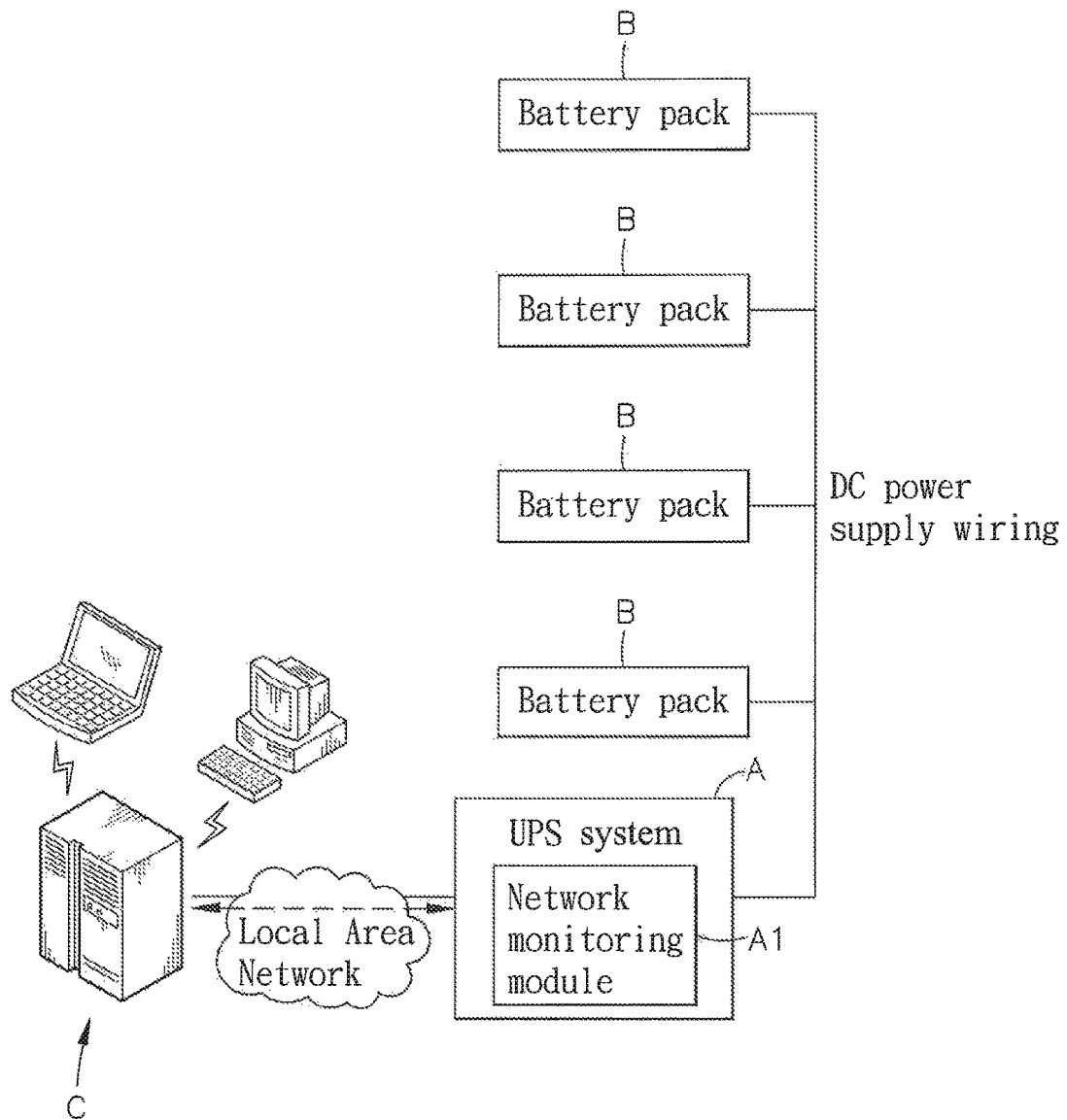
FIG. 7 is a system architecture diagram of a UPS apparatus, a plurality of attached battery packs and an external equipment according to the prior art.
Figure 8:
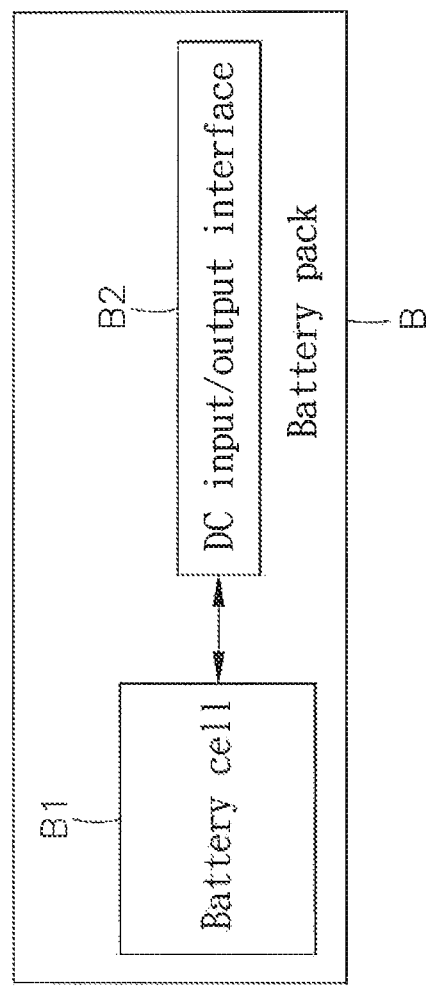
FIG. 8 is a block diagram of an attached battery pack according to the prior art.

Referring to FIGS. 4-6, an operation flow chart, a newly added page of the battery pack management of the web server and a status page of the battery pack management of the web server are shown. As illustrated, the manager can input the IP address, name or MAC address of each attached battery pack 2 into a newly added page through a web browser of the host 31 of the external equipment 3 to add a new battery pack for management, enabling the sensing module 222 of the battery pack monitoring module 22 of each attached battery pack 2 to transmit the status information of the associating battery pack body 21 through the network interfaces 224;124 and the local area network to the UPS monitoring module 12 of the UPS apparatus 1 for storing in the memory 123. Thus, the status information of each attached battery pack 2 can be displayed on the battery pack status page of the web server 120 of the UPS monitoring module 12. Alternatively, the web browser of the host 31 of the external equipment 3 can be linked to the web server 120 of the UPS monitoring module 12, enabling the manager to get the status information of each attached battery pack 2 from the battery pack status page being displayed on the screen 32 for real time monitoring. The method of using a local area network to link to the UPS apparatus 1 and the attached battery pack 2 allows data transmission and communication, and can effectively eliminate the problem of the use of a serial communications interface (RS-232, RS-485), USB, power-line communications that when the loop of one attached battery pack is abnormal, the manager cannot get the information of the other attached battery packs in the backend, or know the current system status of the UPS apparatus.

The linking between the UPS apparatus 1 and attached battery packs 2 and the external equipment 3 comprises the steps of:

(101) The manager links the external equipment 3 to the UPS apparatus 1 through a local area network, and then inputs the IP address or MAC address into a newly added page provided by the built-in web server 120 of the UPS monitoring module 12 to add a new attached battery pack for management.

(102) The UPS monitoring module 12 transmits a request packet to the battery pack monitoring module 22 of the newly attached battery pack 2 for handshaking.

(103) The battery pack monitoring module 22 sends back a reply packet after receipt of the request packet from the UPS monitoring module 12.

(104) The battery pack monitoring module 22 accepts the added management and sends back a reply packet, and then timely transmits a packet of status information to the UPS monitoring module 12, enabling the manager using the web browser of the external equipment to display or update the status information of the attached battery pack 2.

As stated above, the manager can link a computer, notebook computer or any other external equipment 3 to the built-in web server 12 of the UPS monitoring module 12 of the UPS apparatus 1 through a local area network, and then operate the web browser of the host 31 of the computer, notebook computer or any other external equipment 3 to input the IP address (for example, IP=192.168.10.174), name (for example, Battery Pack #2) or MAC address of a newly attached battery pack 2 into a newly added page being provided by the web server 120 to add a new battery pack for management. Thereafter, the UPS monitoring module 12 transmits a request network packet to the battery pack monitoring module 22 of the newly attached battery pack 2 for handshaking. The request network packet contains authentication data that can be account and password, hash value (a result of a hash algorithm performed on a string of text, electronic file or entire hard drives contents), or any other content suitable for identity verification. After received the request network packet from the UPS monitoring module 12 of the UPS apparatus 1, the battery pack monitoring module 22 will send back a reply network packet that contains the authentication data and reply content (accept or not accept to be added into management). If the battery pack monitoring module 22 accepts to be added into management and sends back a reply network packet, the battery pack monitoring module 22 of the attached battery pack 2 will timely transmit a network packet of status information to the UPS monitoring module 12 of the UPS apparatus 1, enabling the battery pack status page of the web server 120 to display the status information of every attached battery pack 2, or, allowing the web browser of the host 31 of the external equipment 3 to be linked through the local area network to the battery pack status page of the web server 120 of the UPS monitoring module 12 to display or update the status information of the attached battery packs 2. Thus, the manager can view the battery pack status page on the screen 32 to get the status information (such as the voltage of the battery pack body 21, the internal voltage and charging current of the internal battery module 211 of the battery pack body 21, the temperature of the battery pack body 21, etc.) of every attached battery pack 2, or use the authentication method between the UPS monitoring module 12 of the UPS apparatus 1 and the battery pack monitoring module 22 of the attached battery pack 2 to effectively prohibit any unauthorized network equipment from accessing to the attached battery packs 2, implementing the effectiveness of information security.

Further, the Log-In IP address in the newly added page of the web server 120 of the UPS monitoring module 12 or the battery pack status page can be, for example, 192.168.10.178; the status of the battery pack body 21 of the attached battery pack 2 can be, for example, fully charged; the battery voltage can be, for example, 54.2V; the remaining runtime can be, for example, 118 mins, the name of the attached battery pack 2 for management can be, for example, Battery Pack #1, Battery Pack #2, Battery Pack #3; the internal voltage of the battery module 211 of the battery pack body 21 can be, for example, 27.1V; the temperature can be, for example, 27° C. or 28° C. However, these examples are for the purposes of illustration only, but not intended for use to limit the scope of the invention.

Further, the manager can operate the web browser of the host 31 of the external equipment 3 to set the event notification of the UPS apparatus 1. When the UPS monitoring module 12 receives a status information from the battery pack monitoring module 22 of one attached battery pack 2 and the received status information is verified by the second microcontroller 121 to be in conformity with the set condition of pre-stored data in the memory 123, the UPS monitoring module 12 will send a network packet of status information or warning message (such as short massage, e-mail, sound signal, voice, light signal, etc.) through the network interface 124 to the manager's external equipment 3. For example, if the UPS monitoring module 12 receives a message that the temperature of the battery pack body 21 been detected by the battery pack monitoring module 22 is over 45° C., it will give off a warning message to notify the manager, enabling the manager to replace the failed or damaged battery pack 2 or the battery pack 2 going to be expired at an early stage, preventing any UPS apparatus 1 failure due to a short circuit or failure of one attached battery pack 2, thereby increasing the convenience in the management of the UPS apparatus 1 and the attached battery packs 2 to protect various electronic devices or equipments and to effectively prolong power backup time.

In conclusion, the invention provides a UPS system comprising a UPS apparatus 1 that comprises a UPS body 11 and a UPS monitoring module 12, and a plurality of attached battery packs 2 electrically coupled to the UPS body 11, wherein each attached battery pack 2 comprises a battery pack body 21, and a battery pack monitoring module 22 that comprises a control unit 221, a sensor module 222 electrically coupled to the control unit 221 for detecting the status information of the battery pack body 21, a memory 223 electrically coupled to the control unit 221 for storing TCP/IP or MAC (Media Access Control) address, manufacturers relational tables and other predetermined data, and a network interface 224 electrically coupled to the control unit 221 for communication with the network interface 124 of the UPS monitoring module 12 through a LAN (Local Area Network) to transmit the status information of the battery pack body 21. When the battery pack monitoring module 22 transmits the status information of the associating battery pack body 21 to the UPS monitoring module 12, the status information will be sent to the UPS monitoring module 12. Thus, the manager can use web browser to link to the web server 120 to get the status information of every attached battery pack 2. The UPS apparatus 1 and the attached battery pack 2 can transmit data and communicate with an external equipment through a local area network, effectively eliminating the problem of the use of a serial communication interface that when the loop of one attached battery pack is abnormal, the manager cannot get the information of the other attached battery packs in the backend, and ensuring the stability and reliability of the overall system.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A UPS (Uninterruptible Power Supply) system with network monitoring and attached battery pack information sensing functions, comprising a local area network, a UPS apparatus, and at least one attached battery pack connected to said UPS apparatus through said local area network, wherein said UPS apparatus comprises a UPS body and a UPS monitoring module having a web server built in said UPS monitoring module, and each attached battery pack comprises a battery pack body and a battery pack monitoring module, wherein said battery pack monitoring module comprises a control unit, a sensor module electrically coupled to said control unit to sense status information of said respective battery pack body, a memory electrically coupled to said control unit to store predetermined data, and a network interface communicating with said UPS monitoring module through said local area network to transmit said status information of said respective battery pack body to said UPS monitoring module, wherein a web browser of an external equipment links to said web server of said UPS monitoring module and obtains said status information of each attached battery pack through said local area network;

wherein said web server of said UPS monitoring module of said UPS apparatus provides a newly added page to input an IP address or MAC address of a new attached battery pack from said web browser of said external equipment, to add said new attached battery pack for management, and to transmit a request network packet to said battery pack monitoring module of said new attached battery pack for handshaking from said UPS monitoring module of said UPS apparatus, and after said battery pack monitoring module accepts to be added into management and sends back a reply packet, said new attached battery pack monitoring module timely transmits a network packet of status information to said UPS monitoring module to display or update said status information of said new attached battery pack on the web browser through said web server of said UPS monitoring module.

2. The UPS system as claimed in claim 1, wherein said UPS body of said UPS apparatus comprises a first microcontroller, a first communication interface, an AC-to-DC charger, a DC-to-AC inverter and a changeover switch, wherein said first communication interface, said AC-to-DC charger, said DC-to-AC inverter and said changeover switch are electrically coupled to said first microcontroller, a DC input/output interface is electrically coupled to said AC-to-DC charger and said DC-to-AC inverter for DC input and output, an AC input interface is electrically coupled to said AC-to-DC charger and said changeover switch, and an AC output interface is electrically coupled to said changeover switch, said changeover switch is electrically coupled to said DC-to-AC inverter.

3. The UPS system as claimed in claim 2, wherein said UPS monitoring module of said UPS apparatus comprises a second microcontroller, a second communication interface electrically coupled with said second microcontroller and said first communication interface of said UPS body, a memory electrically connected to said second microcontroller for storing data, and a network interface electrically connected to said second microcontroller for network communication.

4. The UPS system as claimed in claim 3, wherein said first communication interface of said UPS body and said second communication interface of said UPS monitoring module are USARTs (Universal Synchronous Asynchronous Receiver Transmitters).

5. The UPS system as claimed in claim 3, wherein when said UPS monitoring module receives said status information from said battery pack monitoring module of one of said at least one attached battery pack and said status information is verified by said second microcontroller to be in conformity with a set condition of a pre-stored data in said memory, said UPS monitoring module sends a network packet of status information or a warning message through said network interface of said UPS monitoring module to said external equipment.

6. The UPS system as claimed in claim 1, wherein said battery pack body of each attached battery pack comprises at least one battery module, a DC input/output interface electrically coupled to said at least one battery module and electrically connected to said UPS body of said UPS apparatus through a DC bus, wherein said UPS body transmits a DC power to charge said at least one battery module.

7. The UPS system as claimed in claim 6, wherein said sensor module of said battery pack monitoring module of each attached battery pack comprises a voltage sensing circuit detecting voltage of said battery pack body and internal voltage of said at least one battery module and a current sensing circuit detecting electrical current of said at least one battery module.

8. The UPS system as claimed in claim 6, wherein said sensor module of said battery pack monitoring module of each attached battery pack comprises an environmental sensing circuit detecting internal and surrounding temperature, moisture, air pressure, airflow and contact closure of said battery pack body of said attached battery pack.

9. The UPS system as claimed in claim 1, wherein said request network packet provided by said UPS monitoring module of said UPS apparatus contains an authentication data; said reply network packet provided by said battery pack monitoring module of said new attached battery pack contains said authentication data and a reply content; said authentication data is a combination of an account and a password, or a hash value; said replay content is about accepting or not accepting to be added into management.

* * * * *